(12) United States Patent  
Behzad

(10) Patent No.: US 7,002,238 B2  
(45) Date of Patent: Feb. 21, 2006

(54) USE OF A DOWN-BOND AS A CONTROLLED INDUCTOR IN INTEGRATED CIRCUIT APPLICATIONS

(75) Inventor: Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 57 days.

(21) Appl. No.: 10/854,886

(22) Filed: May 27, 2004

(65) Prior Publication Data

US 2005/0090223 A1 Apr. 28, 2005

Related U.S. Application Data

(60) Provisional application No. 60/513,798, filed on Oct. 23, 2003, provisional application No. 60/515,213, filed on Oct. 28, 2003.

(51) Int. Cl.
*H01L 29/00* (2006.01)
*H01L 39/00* (2006.01)
*H01L 29/40* (2006.01)
*H01L 23/495* (2006.01)
*H01L 23/06* (2006.01)

(52) U.S. Cl. ............... 257/662; 257/663; 257/664; 257/666; 257/684; 257/531

(58) Field of Classification Search ........ 257/662–666, 257/684, 531
See application file for complete search history.

(56) References Cited

U.S. PATENT DOCUMENTS 6,621,140 B1 * 9/2003 Gibson et al. ............... 257/531  
6,828,658 B1 * 12/2004 Schmitz et al. ............. 257/662

* cited by examiner

*Primary Examiner*—Cuong Nguyen  
(74) *Attorney, Agent, or Firm*—Garlick, Harrison & Markison LLP; Bruce Garlick

(57) ABSTRACT

A Radio Frequency (RF) device includes a semi conductive die and a package in which the semi conductive die mounts. The semi conductive die includes a first portion of an RF circuit and a plurality of die pads formed thereon. The package includes a heat slug upon which the semi conductive die resides, a plurality of package pins, a plurality of bond wires, a downbond rail, and a plurality of downbonds. Each of the bond wires couples between a corresponding die pad and a corresponding package pin. The downbond rail couples to the heat slug. At least one downbond couples between a die pad corresponding to the first portion of the RF circuit and a respective location on the downbond rail, serves as an inductor for a second portion of the RF circuit, may include a plurality of downbonds coupled in parallel, and has a length and/or a diameter selected to provide a desired inductance.

32 Claims, 17 Drawing Sheets

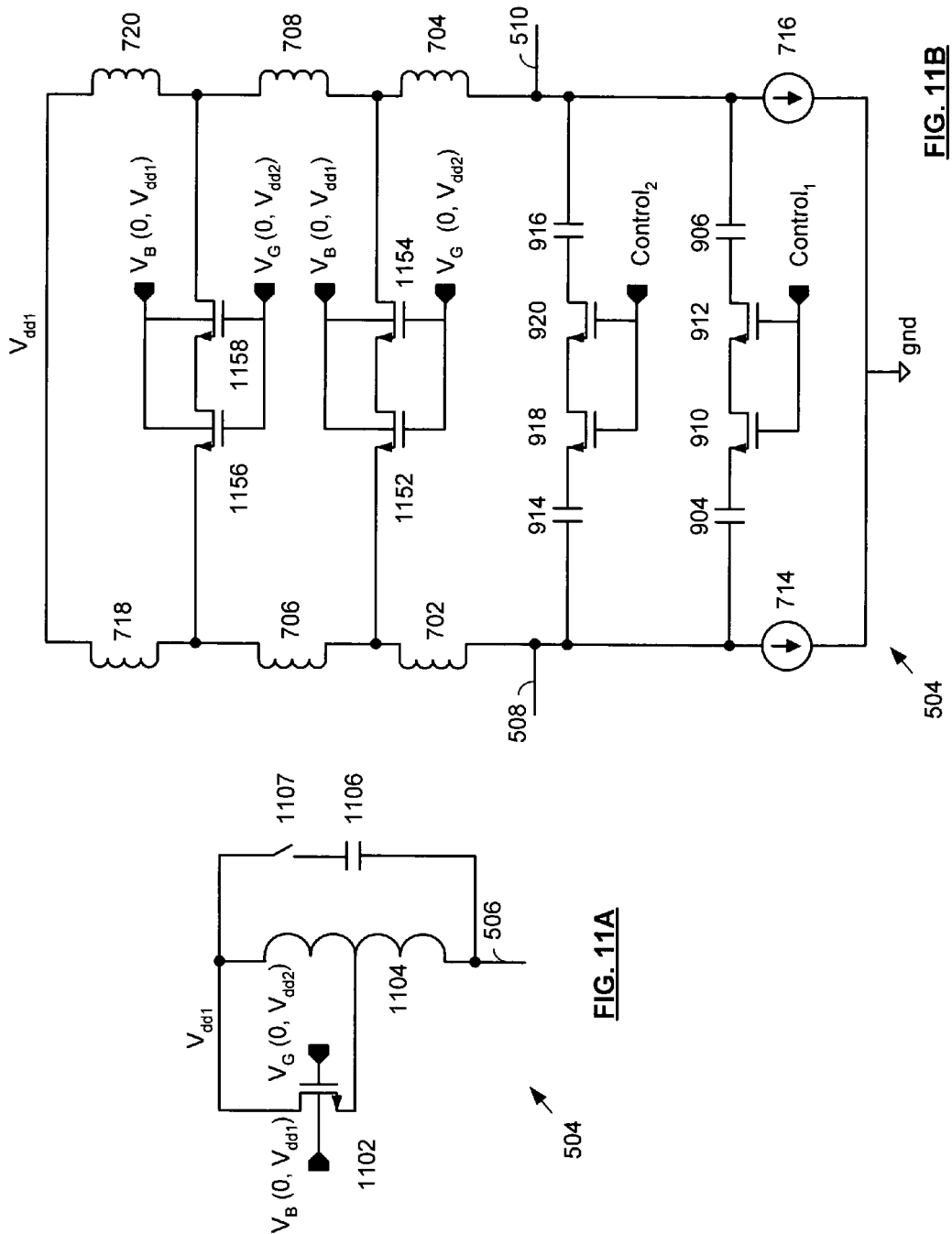

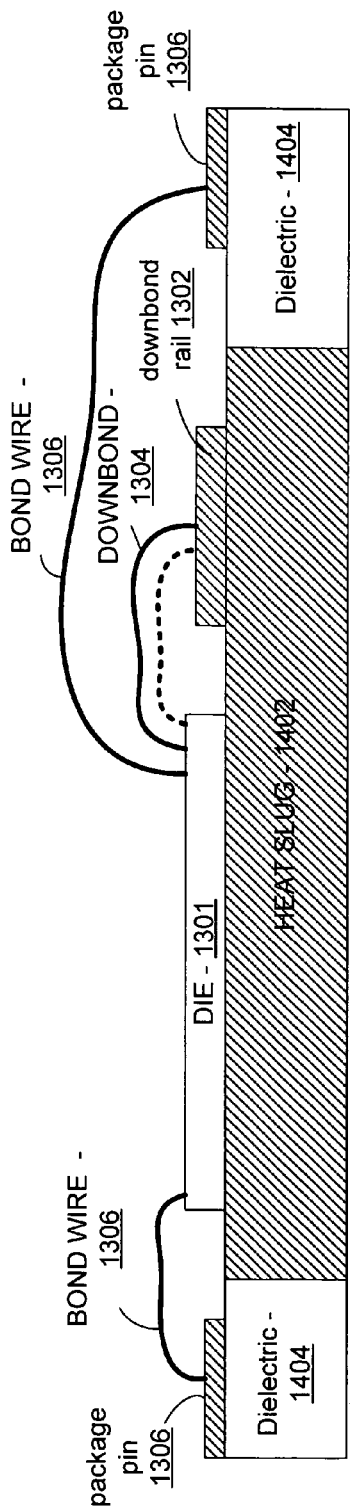
FIG. 14A
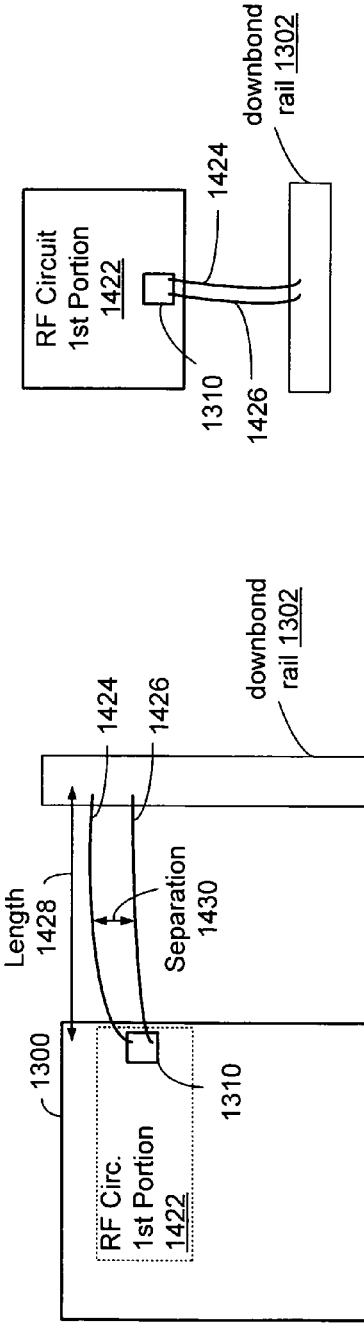
FIG. 14C
FIG. 14B

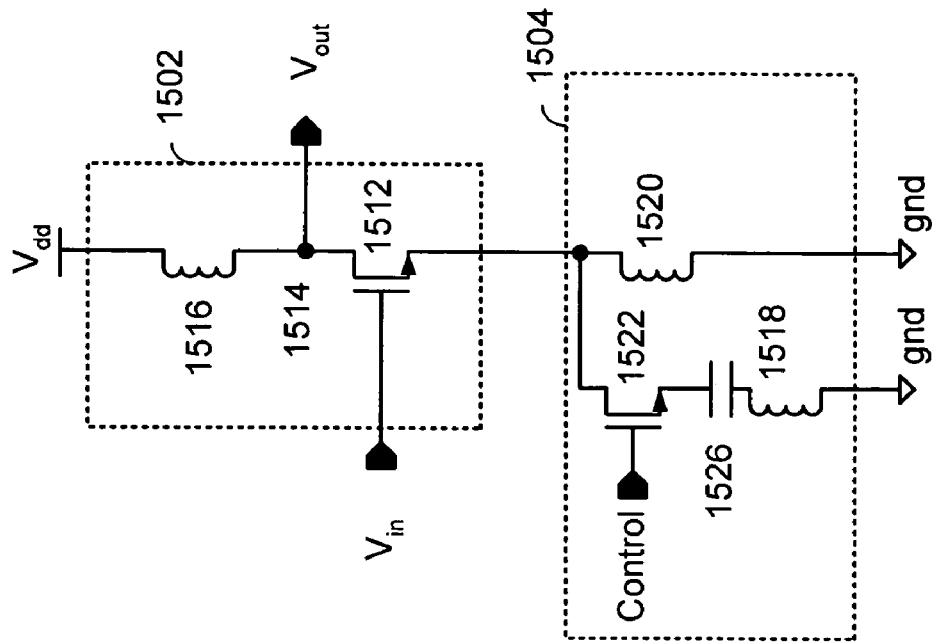
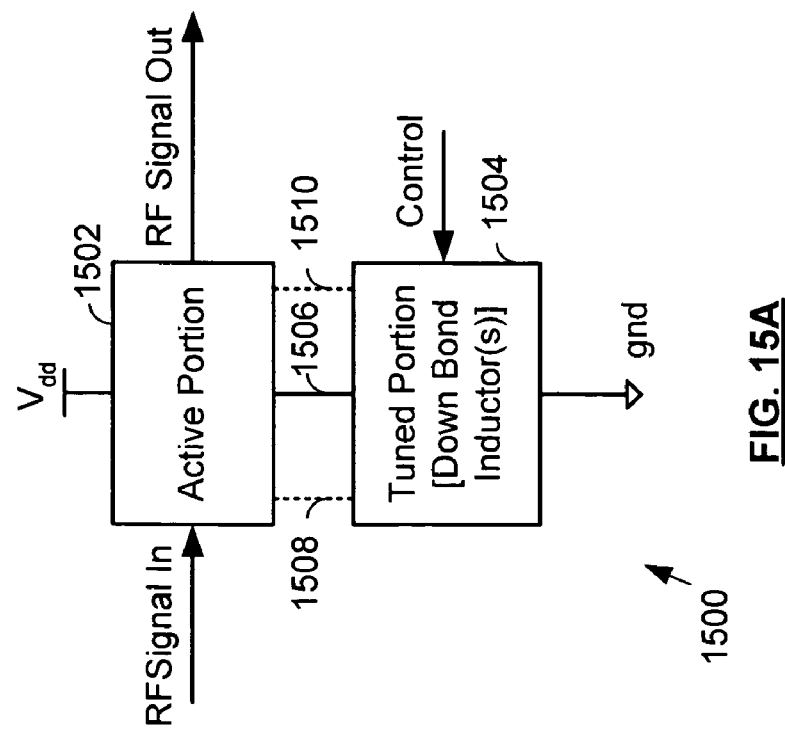
FIG. 15B
FIG. 15A

USE OF A DOWN-BOND AS A CONTROLLED INDUCTOR IN INTEGRATED CIRCUIT APPLICATIONS

CROSS REFERENCE TO RELATED APPLICATION

This application claims priority to U.S. Provisional Patent Application Ser. No. 60/513,798, filed Oct. 23, 2003, to U.S. Provisional Patent Application Ser. No. 60/515,213, filed Oct. 28, 2003, all of which are incorporated herein by reference for all purposes.

BACKGROUND

1. Technical Field

This invention relates generally to communication systems and more particularly to tuned circuits used in components of radio frequency transceivers within such communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Communication systems typically operate in accordance with one or more communication standards. For instance, wired communication systems may operate according to one or more versions of the Ethernet standard, the System Packet Interface (SPI) standard, or various other standards. Wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). Typically, the transceiver includes a data modulation stage and an RF stage. The data modulation stage converts between data and baseband signals in accordance with the particular wireless communication standard. The RF stage converts between baseband signals and RF signals. The RF stage may be a direct conversion transceiver that converts directly between baseband and RF or may include one or more intermediate frequency stages.

The RF stage must produce RF signals, and operate upon RF signals, in differing channels of an allocated frequency band. Thus, filtering and amplifying components of the RF stage are called upon to operate on a variety of center frequencies. In many RF stages, these filtering and amplifying components are tuned to operate at particular center frequencies. By tuning these filtering and amplifying components, the overall gain of the RF stage is optimized and power consumption is reduced. The manner in which the filtering and amplifying stages operate is temperature dependent, process dependent, and may be dependent upon the tuning of adjacent amplifying/filtering stages. Thus, their tuning is dependent upon each of these factors and cannot be adequately tuned via fixed settings.

BRIEF SUMMARY OF THE INVENTION

In order to meet the above-described shortcomings, among others of the prior devices, a Radio Frequency (RF) device constructed according to the present invention includes a semi conductive die and a package in which the semi conductive die mounts. The semi conductive die includes a first portion of an RF circuit and a plurality of die pads formed thereon. The package includes a heat slug upon which the semi conductive die resides, a plurality of package pins, a plurality of bond wires, a downbond rail, and a plurality of downbonds. Each of the bond wires couples between a corresponding die pad and a corresponding package pin.

The downbond rail couples to the heat slug. At least one downbond couples between a die pad corresponding to the first portion of the RF circuit and a respective location on the downbond rail and serves as an inductor for a second portion of the RF circuit. The at least one downbond may include a plurality of downbonds coupled in parallel between the die pad corresponding to the first portion of the RF circuit and respective locations on the downbond rail. The at least one downbond has a length and/or a diameter selected to provide a desired inductance.

The RF device may further include a switch operable to couple/decouple the at least one downbond from the first portion of the RF circuit. In some embodiments, the switch is an NMOS transistor, which may include a DC blocking capacitor. In other embodiments, the switch is a PMOS transistor. The RF device may also include a case, an antenna, and a user interface.

Other features and advantages of the present invention will become apparent from the following detailed description of the invention made with reference to the accompanying drawings.

BRIEF DESCRIPTION OF THE DRAWINGS

FIG. 11A is a schematic diagram illustrating another singled ended embodiment of an RF circuit having an NMOS transistor that serves as a switch according to the present invention;

FIG. 11B is a schematic diagram illustrating another differential embodiment of an RF circuit having an NMOS transistor that serves as a switch according to the present invention;

FIG. 14A is a partial diagrammatic sectional side view taken along a central portion of the RF device of FIG. 13;

FIG. 14B is a partial diagrammatic view of the RF device of FIG. 13 showing in some detail downbonds that form a portion of an RF circuit;

FIG. 14C is another partial diagrammatic view of the RF device of FIG. 13 showing in some detail downbonds that form a portion of an RF circuit;

FIG. 15A is a block diagram illustrating an RF circuit formed according to the embodiment of the present invention in which downbonds are used for inductors of the RF circuit;

FIG. 15B is a schematic diagram illustrating a single ended embodiment of the RF circuit of FIG. 15A showing the manner in which downbonds serve as inductors and how they couple within the RF circuit.

DETAILED DESCRIPTION OF THE DRAWINGS

Figure 1:
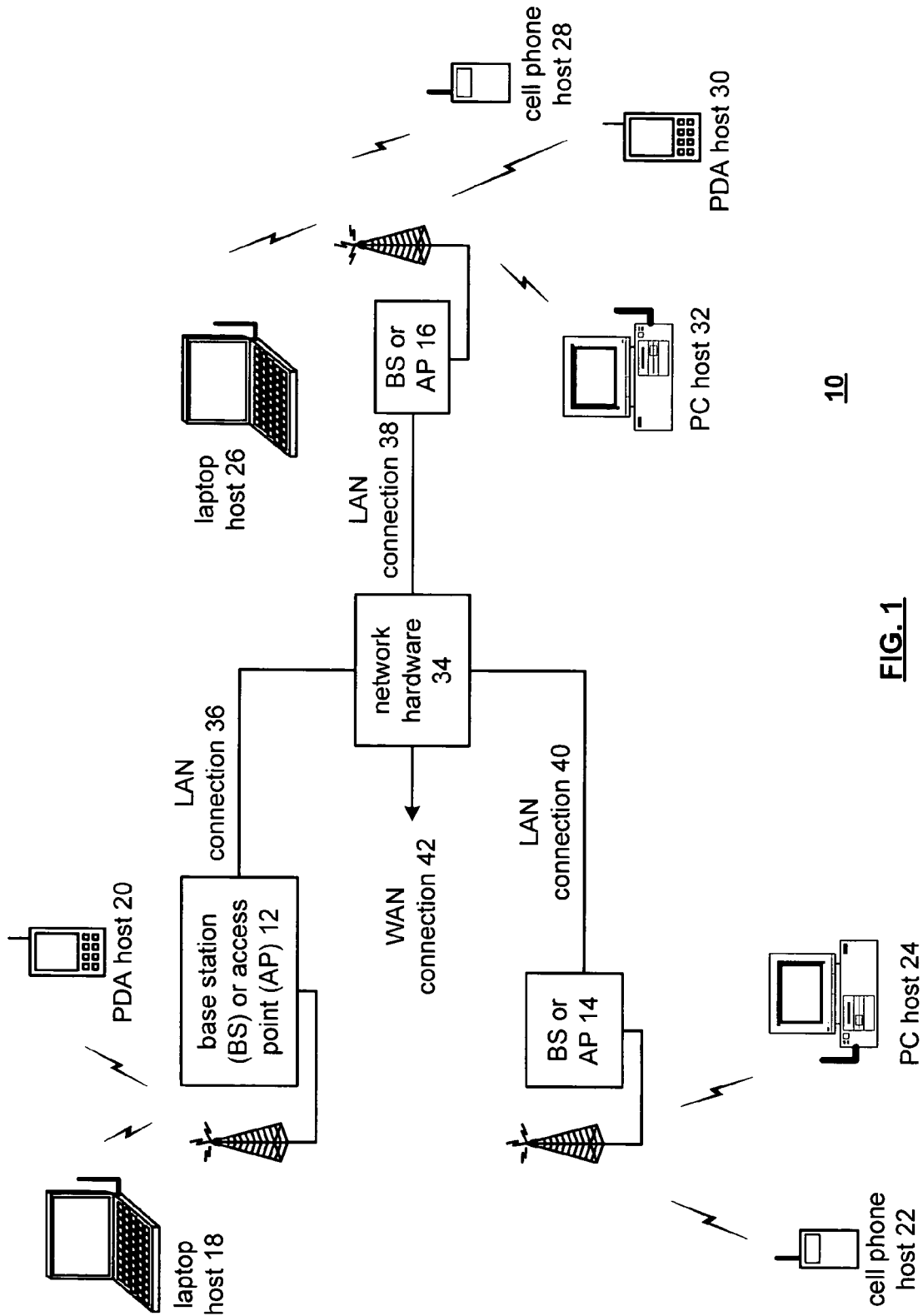
FIG. 1 is a schematic block diagram illustrating a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32, cellular telephone hosts 22 and 28, and/or any other type of device that supports wireless communications. The details of the wireless communication devices will be described with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifiers and/or programmable multi-stage amplifiers as disclosed herein to enhance performance, reduce costs, reduce size, and/or enhance broadband applications.

Figure 2:
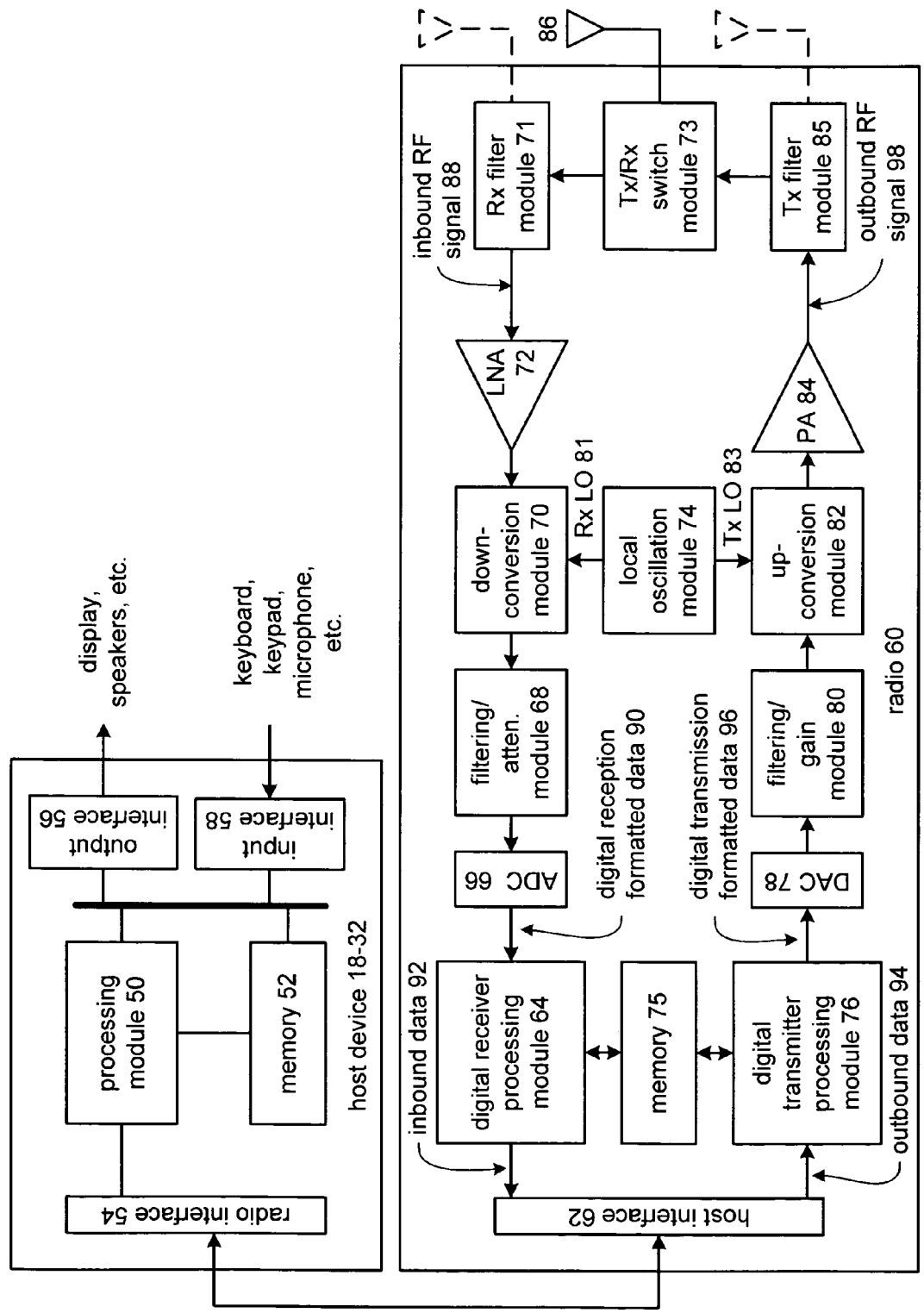
FIG. 2 is a schematic block diagram illustrating a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or may be an externally coupled component that couples to the host device 18–32 via a communication link, e.g., PCI interface, PCMCIA interface, USB interface, or another type of interface.

As illustrated, the host device 18–32 includes a processing module 50, memory 52, radio interface 54, input interface 58, and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera, such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain/ attenuation module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 77, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions that facilitate functionality of the device. In some embodiments, the combination of the digital receiver processing module, the digital transmitter processing module, and the memory 75 may be referred to together as a "baseband processor."

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, IEEE802.11g, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain/attenuation module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 77, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/ gain/attenuation module 68. The filtering/gain/attenuation module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
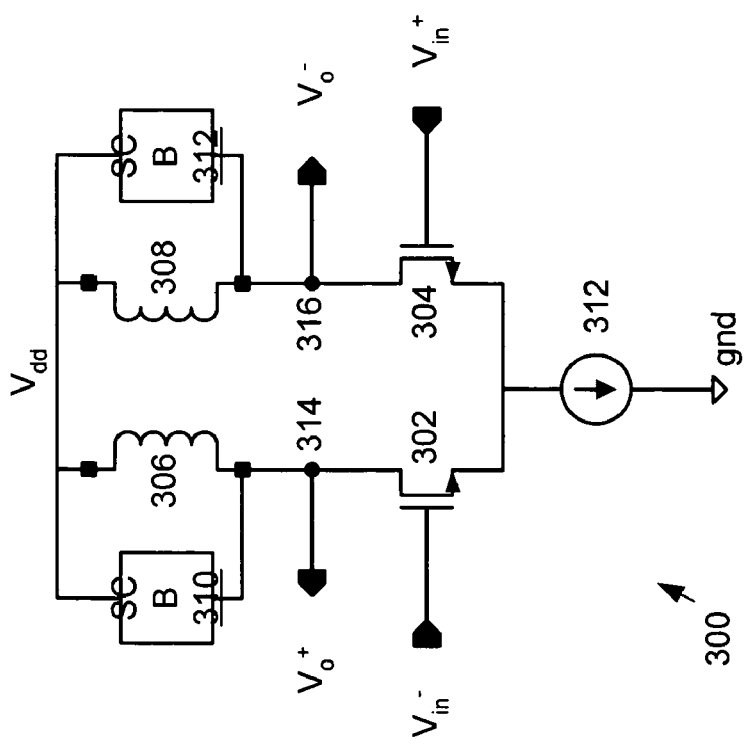
FIG. 3 is a schematic block diagram illustrating a differential tuned Radio Frequency (RF) circuit.

FIG. 3 is a schematic block diagram illustrating a differential Radio Frequency (RF) circuit. The differential RF circuit 300 includes a first side and a second side, both of which are biased by current source 312. Transconductance devices, e.g., transistors 302 and 304, receive differential input RF voltage signals $V_{in}^-$ and $V_{in}^+$ at their gates. The differential RF circuit produces output RF voltage signals $V_o^+$ and $V_o^-$ at output nodes 314 and 316, respectively. The gain/attenuation of the RF circuit 300 is based upon the characteristics of transistors 302 and 304 and the impedance at nodes 314 and 316.

The differential RF circuit 300 further includes inductors 306 and 308 that couple in parallel with switched capacitor banks (SCBs) 310 and 312. The impedance at nodes 314 and 316 is dependent upon the characteristics of the inductors 306 and 308 and the SCBs 310 and 312. In order to provide a maximum impedance at output nodes 314 and 316 multiple selectable center frequencies, SCBs 310 and 312 are switchable to produce a desired capacitance.

Figure 4:
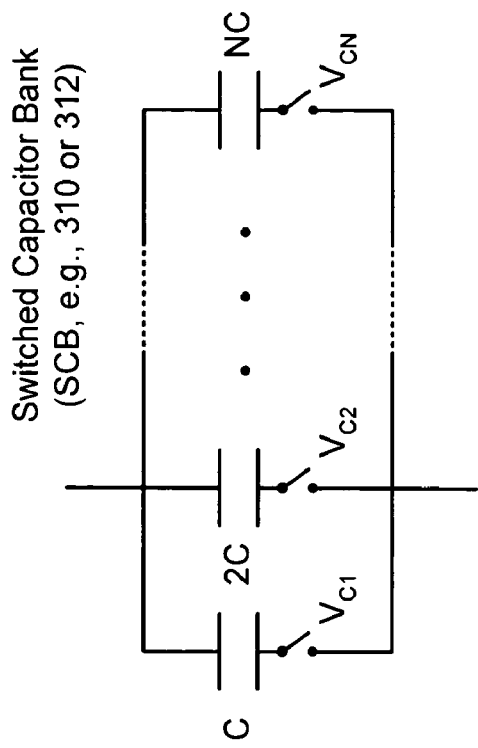
FIG. 4 is a schematic block diagram illustrating a switched capacitor bank of the RF circuit of FIG. 3.

FIG. 4 is a schematic block diagram illustrating a switched capacitor bank 310 or 312 of the differential RF circuit 300 of FIG. 3. The SCBs 310 or 312 of the differential RF circuit 300 of FIG. 3 each include a plurality of capacitors coupled in parallel. Each of the capacitors is switchable to be coupled to or decoupled from the other capacitors. Capacitors C, 2C, . . . , NC provide significant adjustability in the overall capacitance of the SCB 310 or 312. Thus, via the various switch settings $V_{C1}$, $V_{C2}$, . . . , $V_{CN}$, the RF circuit 300 of FIG. 3 may be tuned for any particular center frequency in a designed operating range.

Referring again to FIG. 3, SCBs 310 and 312 are switched so that the impedance at output nodes 314 and 316 is a local maximum at a selected operating frequency. Resultantly, the gain of the differential RF circuit 300 is maximum at the selected operating frequency. With the approach of FIG. 3, inductors 306 and 308 must be sized such that with all SCB 310/312 switches closed, the RF circuit is tuned to the lowest desired center frequency. Assuming a fixed inductance and switched capacitors for tuning, if the desired tuning range is large, the signal amplitude at the low end of the frequency range would drop since the impedance of the tuned load is lower at the lower frequencies.

Figure 5A:
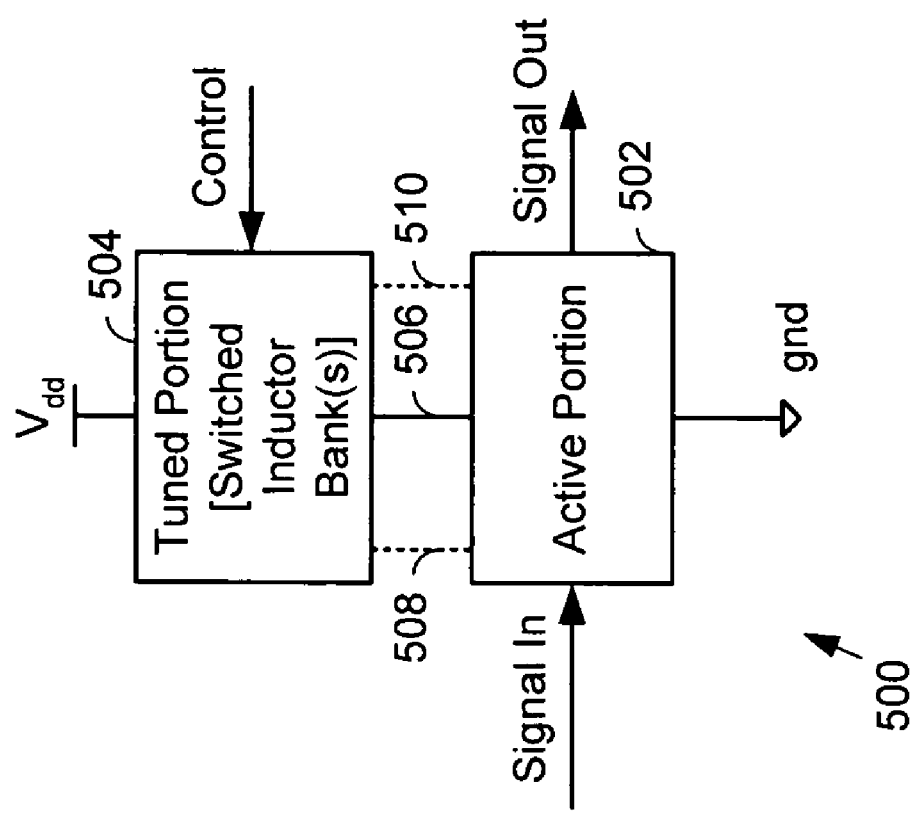
FIG. 5A is a schematic block diagram generally illustrating an RF circuit constructed according to the present invention.

FIG. 5A is a schematic block diagram generally illustrating an RF circuit constructed according to the present invention. The RF circuit 500 includes an active portion 502 and a tuned portion 504. The active portion 502 receives an RF signal at its input and operates upon the RF signal to produce an RF signal out. The RF circuit 500 of FIG. 5A also includes a tuned portion 504 that includes one or more switched inductors. The tuned portion 504 receives a control signal that switches the inductors in and out of the tuned portion 504 so that a particular frequency of operation may be selected.

The RF circuit 500 may be single-ended or differential. When the RF circuit 500 is single-ended, a single coupling line 506 couples the active portion 502 to the tuned portion 504. Alternately, when the RF circuit 500 is differential, coupling lines 508 and 510 couple the active portion 502 to the tuned portion 504. Further, when the RF circuit is differential, the active portion receives differential RF signals and produces differential RF signals. In some embodiments, the RF signal(s) is/are produced at a juncture of the active portion 502 and the tuned portion 504.

Figure 5C:
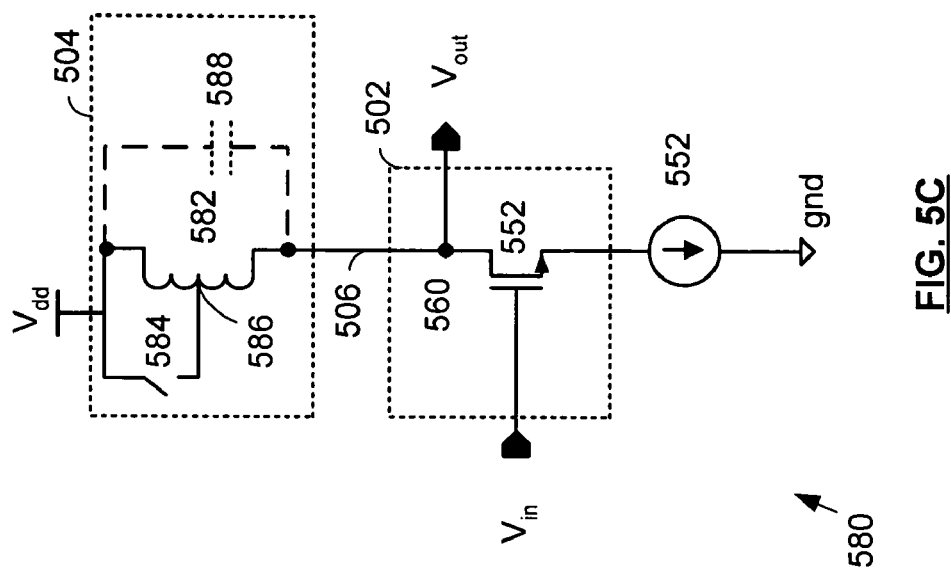
FIG. 5C is a schematic diagram illustrating another embodiment of the RF circuit of FIG. 5A.
Figure 5B:
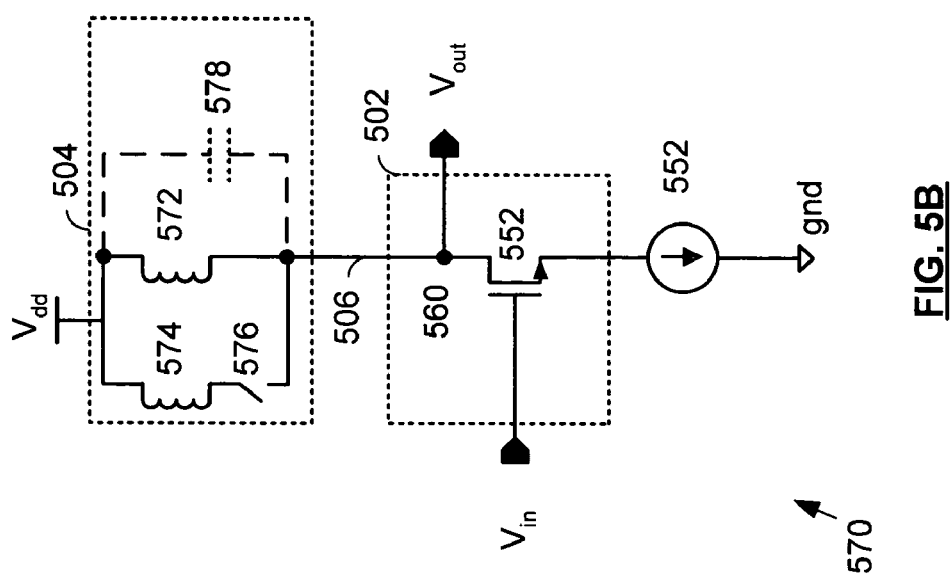
FIG. 5B is a schematic diagram illustrating one embodiment of the RF circuit of FIG. 5A.

FIG. 5B is a schematic diagram illustrating another embodiment of the RF circuit of FIG. 5A. The active portion 502 includes transistor 552 and output node 560. The RF circuit 570 also includes current source 552. As distinguished from the circuit of FIG. 5B, the tuned portion 504 includes a first inductor 572, a second inductor 574, and a switch 576. The switch 576 couples/decouples the second inductor 574 to/from the first inductor 572. In combination, when the switch 576 is closed, the second inductor 574 couples in parallel with the first inductor 572 to produce first tuning characteristics. Further, when the switch 576 is open, the second inductor 574 is decoupled from the first inductor 572 such that the tuned portion 504 has second tuning characteristics. When the switch 576 is closed, the RF circuit 570 has a maximum gain at a first frequency. When the switch 576 is open, the RF circuit 570 has a maximum gain at a second frequency. The tuned portion 504 of the circuit of 570 may also include at least one capacitance 578 coupled in parallel with the first inductor 572. The capacitance 578 may be a single capacitor, a switched capacitor bank, or simply parasitic capacitance. When a lumped capacitance is used, a switch may couple the capacitance in and out of the circuit.

With the embodiment of FIG. 5B, the tuned portion 504 produces a maximum impedance at output node 560 that may be moved in frequency based upon the state of switch 576. Thus, the first tuning characteristics of the tuned portion 504 correspond a maximum impedance of the output node 560 at a first frequency while the second tuning characteristics of the tuned portion 504 correspond to a maximum impedance at the output node 560 at a second frequency.

Because the number of components of the tuned portion 504 of FIG. 5B are limited, only a pair of tuned frequencies are selectable. However, as will be described further with reference to FIGS. 7, 9, 11, by adding additional switched capacitors and/or switched inductors, the RF circuit 570 may be tuned to a number of different operating frequencies to more precisely support a desired frequency band.

The RF circuit 570 may be a driver, a mixer, an amplifier, or another device within an RF transceiver 60, as were illustrated in FIG. 2. As will be described further with reference to FIGS. 7–12, the switch 576 may comprise a PMOS transistor, an NMOS transistor in combination with a dc-blocking capacitor, or a specially constructed NMOS transistor that provides appropriate ON conductance without requiring dc-blocking capacitors.

FIG. 5C is a schematic diagram illustrating still another embodiment of the RF circuit of FIG. 5A. The RF circuit 580 includes an active portion 502 having components same or similar as the active portion 502 of FIG. 5B. The tuned portion 504 of the RF circuit 580 includes an inductor 582 having a first terminal, a second terminal, and an intermediate tap 586. The tuned portion 504 further includes a switch 584. The switch 584 couples between the second terminal (also coupled to $V_{dd}$ in the embodiment) and the intermediate tap 586. When the switch 584 is closed, the tuned portion 504 has first tuning characteristic. When the switch 584 is open, the tuned portion 504 has second tuning characteristics. Effectively, the switch 584 couples/decouples a portion of the inductor 582 to/from the tuned portion 504. As with the embodiment of FIG. 5C, a capacitor 588 may be included in the tuned portion 504. As is also the case with the embodiments of FIGS. 5B and 5C, the switch 584 may take the form of a PMOS transistor, an NMOS transistor in series with one or more dc-blocking capacitors, or an NMOS transistor formed according to the embodiments of FIGS. 10–12.

Figure 6B:
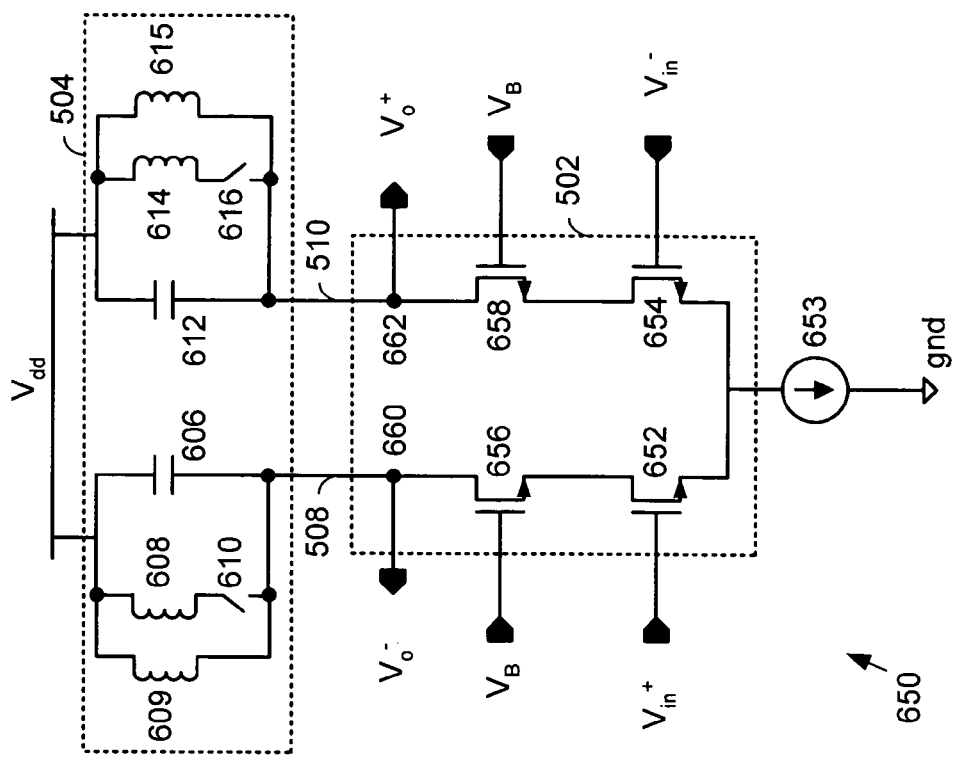
FIG. 6B is a schematic diagram illustrating another differential embodiment of the RF circuit of FIG. 5A.
Figure 6A:
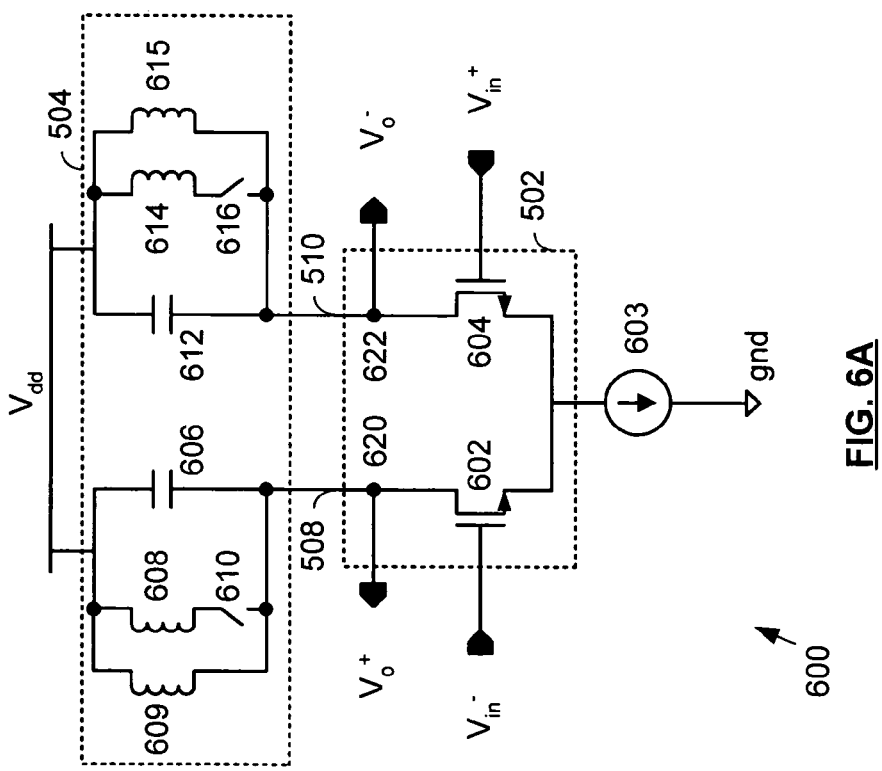
FIG. 6A is a schematic diagram illustrating a differential embodiment of the RF circuit of FIG. 5A.

FIG. 6A is a schematic diagram illustrating a differential embodiment of the RF circuit of FIG. 5A. The differential RF circuit 600 includes a differential active portion 502 and a differential tuned portion 504. The differential active portion 502 receives a differential RF signal ($V_{in}^+$ and $V_{in}^-$). The RF circuit 600 produces differential RF signal ($V_O^+$ and $V_O^-$). The differential active portion 502 includes transistors 602 and 604 and output nodes 620 and 622. Current source 603 biases the other elements of the RF circuit 600. Coupling lines 508 and 510 couple the differential active portion 502 to the differential tuned portion 504. A first side of the differential tuned portion 504 includes first inductor 608, second inductor 609, capacitor 606, and switch 610. A second side of the differential tuned portion 504 includes capacitor 612, first inductor 614, second inductor 615, and switch 616. The structure of the differential circuit 600 of FIG. 6A is effectively a differential version of the RF circuit 570 of FIG. 5B. The capacitor 606 may be a lumped capacitance or simply parasitic capacitance.

FIG. 6B is a schematic diagram illustrating another differential embodiment of the RF circuit of FIG. 5A. The differential RF circuit 650 has an active portion 502 that is a cascode amplifier and that includes transconductance transistors 652 and 654, cascode transistors 656 and 658, and output nodes 660 and 662. The cascode transistors 656 and 658 provide isolation to the transconductance transistors 652 and 654. The transistors 652 and 654 may, in other embodiments, be replaced by linearized transconductance devices having multiple transistors that provide more linear operation in a desired operating range. Current source 653 provides biasing for the active portion 502 and the tuned portion 504. The tuned portion 504 of the differential RF circuit 650 includes capacitors 606 and 612, inductors 608, 609, 614, and 615, and switches 610 and 616.

Figure 7:
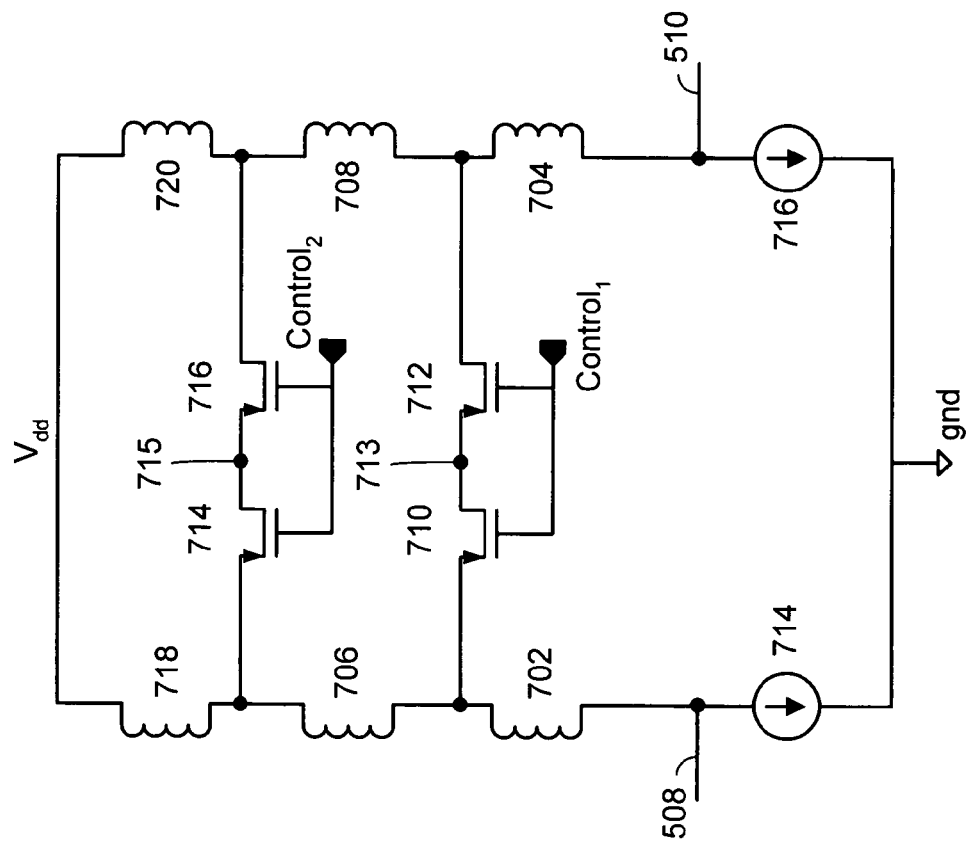
FIG. 7 is a schematic diagram illustrating a differential embodiment of the tuned portion of the RF circuit of FIG. 5A.

FIG. 7 is a schematic diagram illustrating a differential embodiment of the tuned portion 504 of the RF circuit of FIG. 5A. The differential tuned portion 504 may be used in conjunction with any differential RF circuit constructed according to the present invention. The differential tuned portion 504 includes current sources 714 and 716. Coupling lines 508 and 510 couple the differential tuned portion 504 to an differential active portion 502.

The differential tuned portion 504 includes inductors 702, 704, 706, 708, 718, and 720. The differential tuned portion 504 includes two switch legs that may be separately controlled via control signals Control$_1$ and Control$_2$. A first switch leg includes PMOS transistors 710 and 712 that are controlled by Control$_1$. When these PMOS transistors 710 and 712 are turned ON, they effectively short the upper terminals of inductors 702 and 704 such that remaining inductors 706, 708, 718, and 720 decoupled from inductors 702 and 704. When PMOS transistors 710 and 712 are turned OFF by Control$_1$ being logic high, inductors 706, 708, 718, and 720 may form a portion of the differential tuned portion 504 (depending upon the state of PMOS transistors 714 and 716.

The PMOS transistors 714 and 716, controlled by the signal Control$_2$, may be turned ON via a logic low signal so that they provide a short across the upper terminals of inductors 706 and 708 (lower terminals of inductors 718 and 720). As the reader will appreciate, by appropriate setting of Control$_1$ and Control$_2$, the tuning characteristics of the differential tuned portion 504 may be controlled to select a particular operating frequency. Center nodes 713 and 715 of the switch legs may be coupled to V$_{dd}$, to ground, or may be simply left floating, depending upon the particular implementation.

Figure 8:
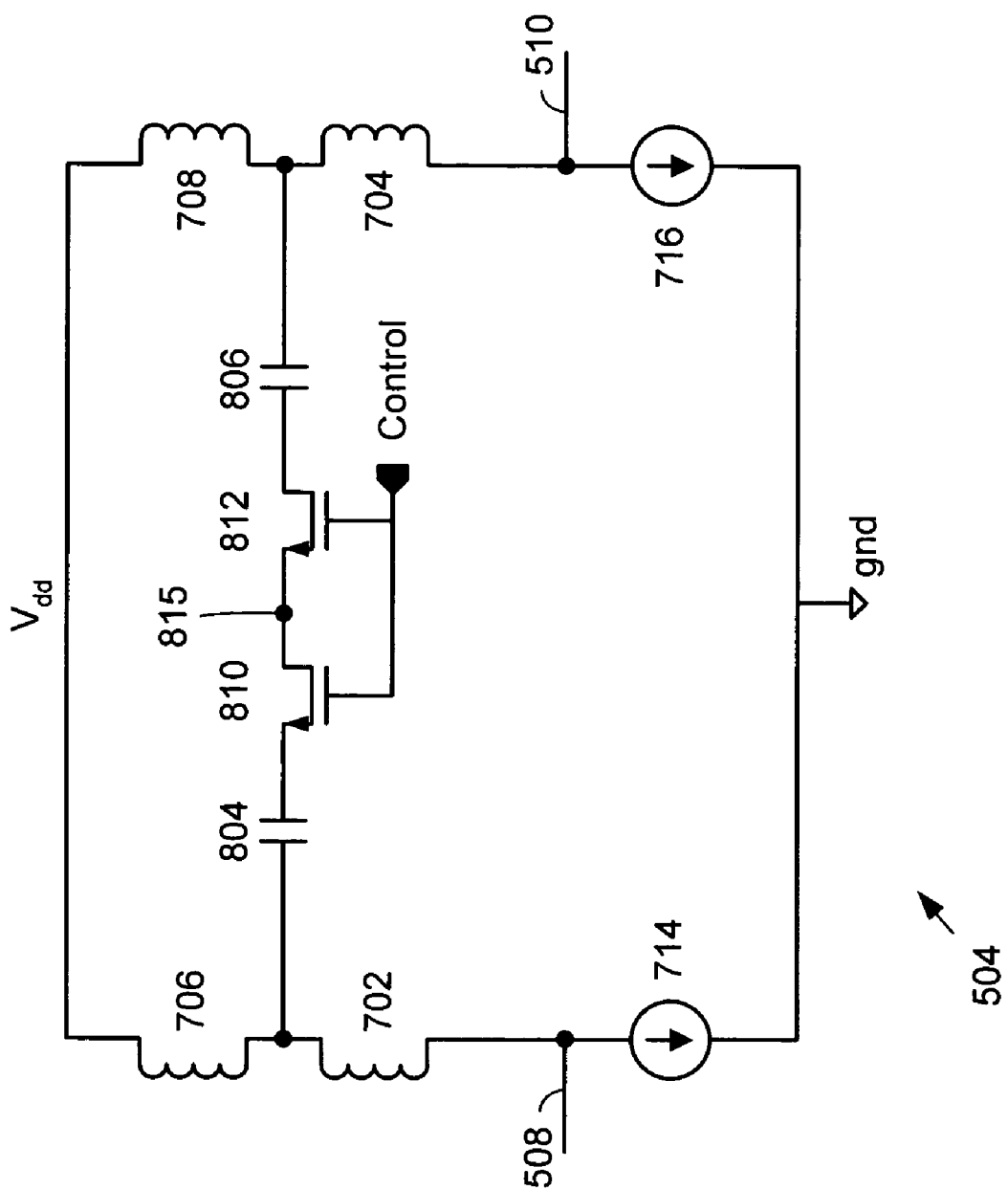
FIG. 8 is a schematic diagram illustrating another differential embodiment of the tuned portion of the RF circuit of FIG. 5A.

FIG. 8 is a schematic diagram illustrating another differential embodiment of the tuned portion 504 of the RF circuit of FIG. 5A. As contrasted to the switch legs of FIG. 7 that included PMOS transistors 710, 712, 714, and 716, the switch legs of the differential tuned portion 504 of FIG. 8 includes NMOS transistors 810 and 812 joined at center node 815. In some constructs, the tanks in which inductors 702, 704, 706, and 706 are constructed are tied to V$_{dd}$. Thus, to properly bias NMOS transistors 810 and 812 so that they may be turned ON and OFF, dc-blocking capacitors 804 and 806 must be employed. When the NMOS transistors 810 and 812 are turned ON by applying a logic high signal, i.e., V$_{dd}$, the lower terminals of inductors 706 and 708 (upper terminals of inductors 702 and 704) are effectively shorted so that inductors 706 and 708 are decoupled from inductors 702 and 704. With transistors 810 and 814 turned ON, therefore, tuning is provided by inductors 702 and 704. When NMOS transistors 810 and 812 are turned OFF, inductors 702, 706, 704, and 708 all participate in the operation of the differential tuned portion 504 and the tuning of the differential RF circuit.

Figure 9:
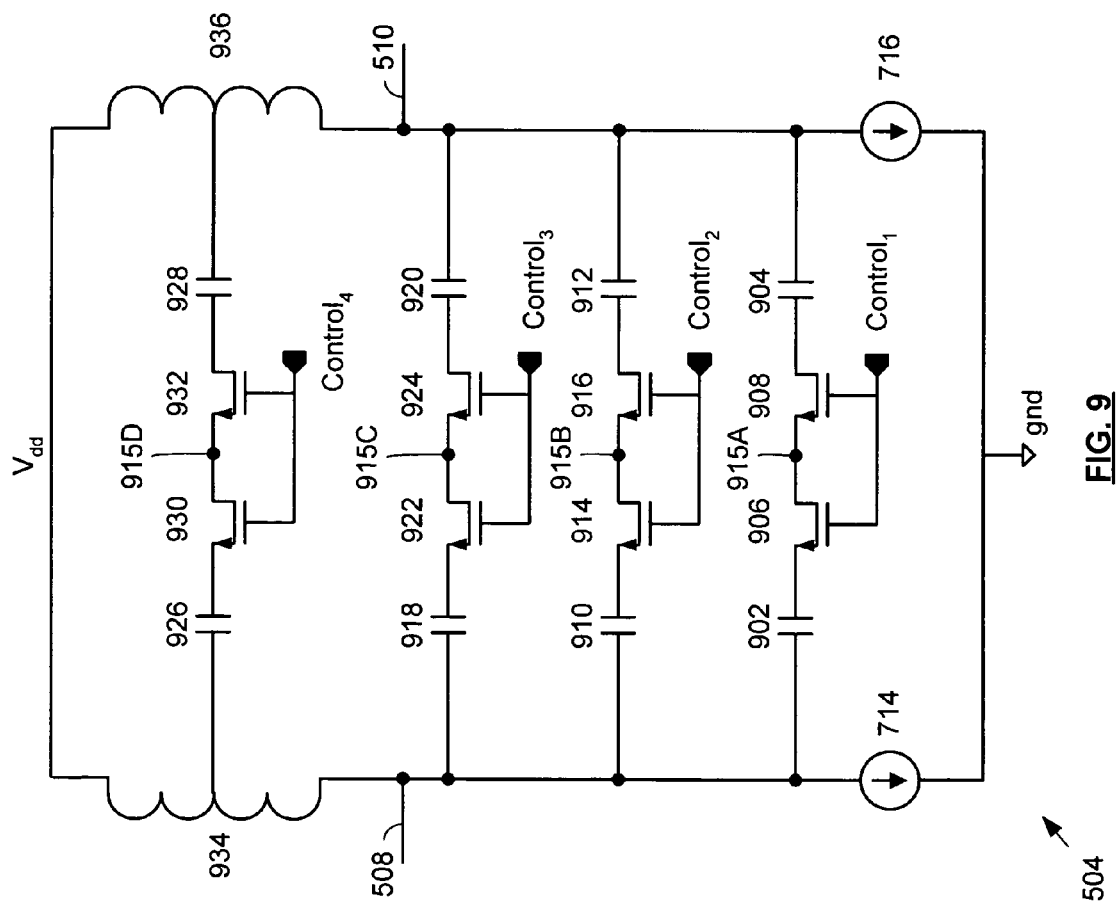
FIG. 9 is a schematic diagram illustrating still another differential embodiment of the tuned portion of the RF circuit of FIG. 5A.

FIG. 9 is a schematic diagram illustrating still another differential embodiment of the tuned portion 504 of the RF circuit of FIG. 5A. As contrasted to the prior illustrated embodiments, the differential tuned portion 504 of FIG. 9 includes tuning capacitors oriented along three separate switched legs. A first switched leg includes tuning capacitors 902 and 904 and NMOS transistors 906 and 908. These tuning capacitors 904 and 902 may be switched in and out of the differential tuned portion 504 via appropriate level of Control$_1$. Likewise, a second tuning leg includes tuning capacitors 910 and 912 controlled by NMOS transistors 914 and 916 via Control$_2$. Further, a third tuning leg includes tuning capacitors 918 and 920 controlled by NMOS transistors 922 and 924 via Control$_3$. Central nodes 915A, 915B, and 915C may be tied to ground, to V$_{dd}$, or may be allowed to float depending upon the embodiment. In other embodiments, each of the NMOS transistor pairs may be replaced by a single NMOS transistor.

Another difference of the embodiment of FIG. 9 is that the tuned portion stage 504 includes inductors 934 and 936 having a first terminal, a second terminal, and an intermediate tap. These inductors 934 and 936 have their intermediate taps coupled by transistors 930 and 932 and dc-blocking capacitors 926 and 928 that meet at center node 915D. When the NMOS transistors 932 and 930 are turned ON via appropriate Control$_4$ signal level, the intermediate taps of inductors 934 and 936 are coupled such that the effective inductance of the differential tuned portion 504 is reduced.

Figure 10B:
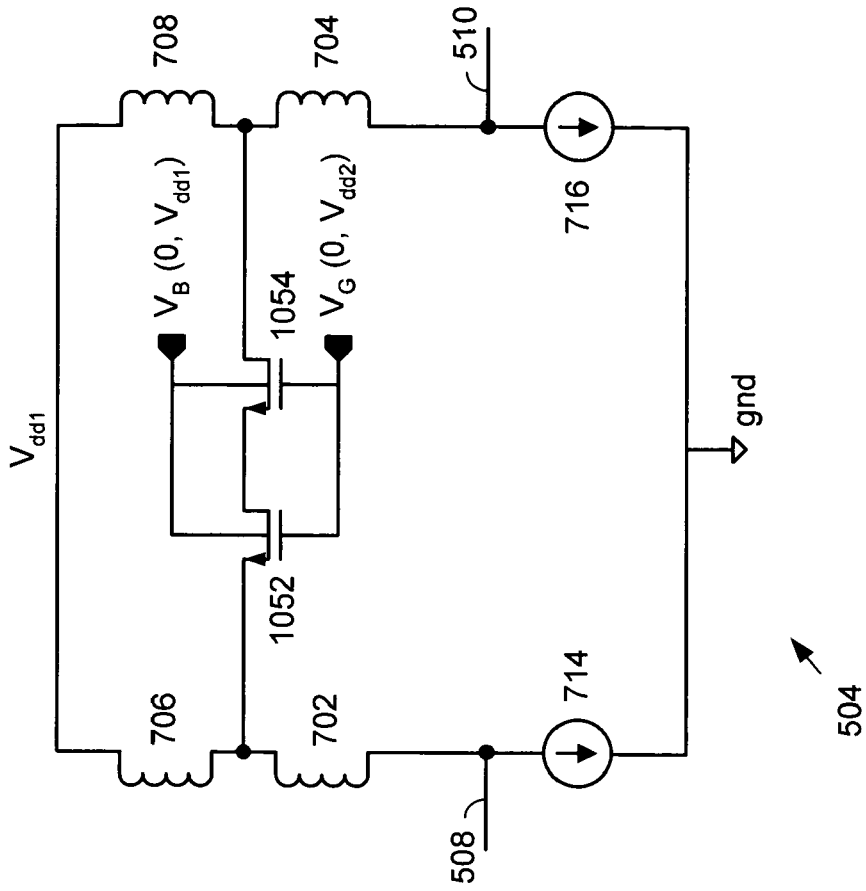
FIG. 10B is a schematic diagram illustrating a differential embodiment of an RF circuit having an NMOS transistor switch constructed according to the present invention.
Figure 10A:
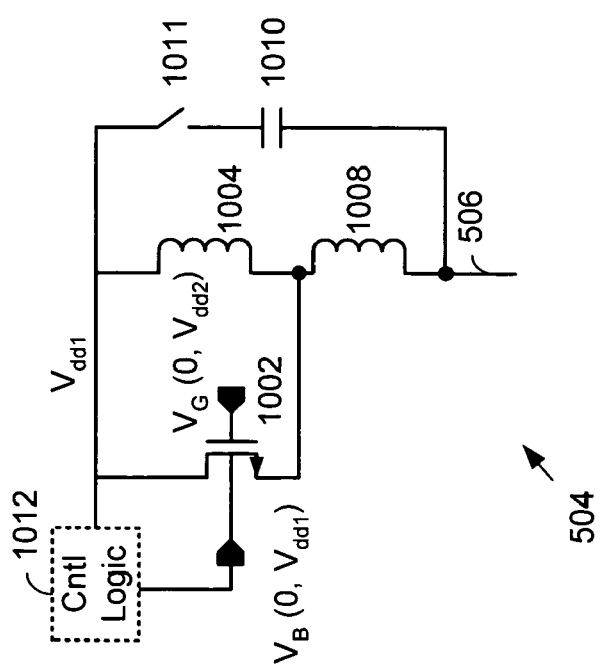
FIG. 10A is a schematic block diagram illustrating a singled ended embodiment of an RF circuit having an NMOS transistor that serves as a switch according to the present invention.

FIG. 10A is a schematic block diagram illustrating a single ended embodiment of an RF circuit 504 having an NMOS transistor 1002 that serves as a switch according to the present invention. The tuned portion 504 includes a first inductor 1008, a second inductor 1004, and the NMOS transistor 1002. The tuned portion 504 may optionally include a capacitor 1010 coupled/decoupled by switch 1011 as illustrated.

The second inductor 1004, as well as the first inductor 1008, is/are typically formed in a tank of a monolithic semi conductive substrate. The tank is typically tied to a first supply voltage V$_{dd1}$, e.g. 1.8V. In order to be able to switch the second inductor 1002 in and out of the tuned portion 504, PMOS transistors (FIG. 7) or NMOS transistors with dc-blocking capacitors (FIGS. 8–9) must be employed. However, PMOS transistors have several times the capacitance for a given ON resistance as compared to NMOS transistors, such capacitance being undesirable. Further, the dc-blocking capacitors of FIGS. 8–9 require significant die area and have fairly large parasitic values. In order to avoid using PMOS transistors or NMOS transistors with dc-blocking capacitors, higher voltage, e.g., 3.3V NMOS transistors may be employed (and 3.3V logic used to turn them ON and OFF). The problem with this is that the 3.3V devices have much worse performance than lower voltage/thinner gate oxide devices, e.g., 1.8V devices.

Thus, according to the present invention, a novel technique is employed with an NMOS transistor 1002 used to switch inductor 1004 in and out of the tuned portion 504. In particular, NMOS transistor 1002 has a gate, a drain, a source, and a body. The structure of the NMOS transistor is illustrated in more detail in FIG. 12A, which will be described later herein. The drain and source terminals operably couple and decouple the second inductor 1004 to/from the first inductor 1008. With one embodiment, the body of the NMOS transistor 1002 ($V_B$) is tied to a first voltage supply $V_{dd1}$, e.g., 1.8V. The NMOS transistor 1002 is turned ON by applying a second voltage supply $V_{dd2}$, e.g., 3.3V, to the gate ($V_G$). The NMOS transistor is turned OFF by applying a reference voltage, e.g., gnd, to the gate $V_G$.

Thus, with $V_{dd2}$ at 3.3 volts and $V_{dd1}$ at 1.8 volts, the NMOS transistor 1002 is turned ON and the NMOS transistor 1002 effectively decouples second inductor 1004 from first inductor 1008 by applying a short across second inductor 1004. The NMOS transistor 1002 is turned OFF by applying the reference voltage (gnd) to the gate of the NMOS transistor 1002, the reference voltage (gnd) being less than the first voltage supply $V_{dd1}$. Thus, in all operations the NMOS transistor 1002 has no voltage greater than 1.8V across any two of its four terminals (Source, Drain, Gate, Body) and is therefore not compromised in its use for this purpose.

As an improved embodiment, control logic 1012 controls the body voltage $V_B$ of the NMOS transistor 1002. The control logic 1012 runs on the 1.8V supply. When the NMOS transistor 1002 is turned ON the body is tied to 1.8V, $V_t$ is reduced (with no body effect) and the ON resistance is minimized. However, when the NMOS transistor 1002 is turned OFF, $V_B$ is tied to ground, which increases the reverse bias on the Source-Body and Drain-Body junctions reducing the effective junction capacitance of the NMOS transistor 1002 in the OFF mode. This biasing also guarantees that the Source-Body and Drain-Body junctions are not forward biased during normal operation with the device turned OFF with large signal swings present.

FIG. 10B is a schematic diagram illustrating a differential embodiment of an RF circuit having an NMOS transistor switch constructed according to the present invention. The differential tuned portion 504 may couple to an active portion of the RF circuit as has previously been illustrated in FIGS. 5A–9. The tuned portion 504 includes inductors 702, 704, 706, and 708. Current sources 714 and 716 provide the proper biasing between the supply voltage $V_{dd}$ and ground and for the differential signal format. According to the present invention, NMOS transistors 1052 and/or 1054 are controlled to adjust the effective inductance of the tuned portion 504. NMOS transistors 1052 and 1054 are turned OFF by applying a reference ground to the gates of the NMOS transistors 1052 and 1054. Holding the body of the transistors at the first voltage supply and applying the second supply voltage to the gates of the NMOS transistors 1052 and 1054 turns the NMOS transistors ON. With the NMOS transistors 1052 and 1054 turned ON, a short is effectively created across the lower terminals of inductor pair 706 and 708 (upper terminals of inductor pair 702 and 704) so that the inductor 706 and 708 are effectively removed from tuning of the tuned portion 504. Thus, an RF circuit having tuned portion 504 will have differing tuning characteristics when the NMOS transistors 1052 and 1054 are turned ON as compared to when the NMOS transistors 1052 and 1054 are turned OFF.

The NMOS transistors 1054 and 1052 may be constructed according to the structure of FIG. 12, in one embodiment. In another embodiment, a single NMOS transistor 1052 or 1054 may be employed to create an effective short at the junctions of the transistor pairs. The reader will appreciate the application of the particular NMOS switch structure for coupling in or decoupling inductors from a tuned portion of an RF circuit for the structures previously illustrated.

FIG. 11A is a schematic diagram illustrating another singled ended embodiment of an RF circuit having an NMOS transistor that serves as a switch according to the present invention. As shown, a tuned portion 504 includes an inductor 1104 having a first terminal, a second terminal, and an intermediate tap defining a first portion of the inductor 1104 and a second portion of the inductor 1104. An NMOS transistor 1102 has a gate, a drain, a source, and a body. The drain and source operably couple/decouple the second portion of the inductor to/from the first portion of the inductor. The body $V_B$ of the NMOS transistor 1102 is tied to a first voltage supply $V_{dd1}$ (at least when the transistor is turned ON). The NMOS transistor 1102 is turned ON by applying a second voltage supply to the gate $V_G$, while the NMOS transistor 1102 is turned OFF by applying a reference voltage, e.g., a reference ground, to the gate $V_G$ of the NMOS transistor 1102. The reference ground is less than the second voltage supply $V_{dd2}$. According to another embodiment, as was described with reference to FIG. 10A for the singled ended embodiment, control logic may be employed. In such case, $V_B$ is tied to Vdd1 when the transistors 1052 and 1054 are turned ON and $V_B$ is tied to gnd when the transistors 1052 and 1054 are turned OFF.

FIG. 11B is a schematic diagram illustrating another differential embodiment of an RF circuit having an NMOS transistor that serves as a switch according to the present invention. The differential tuned portion 504 may employ NMOS transistors of the present invention to switch its inductors. Particularly, the tuned portion 504 of FIG. 11B differs from the structure of FIG. 9 in that NMOS transistors 1152 and 1154 are employed in one tuning leg to produce a short at the upper terminals of inductors 702 and inductors 706 (lower terminals of inductors 704 and 708). Further, NMOS transistors 1156 and 1158 serve in another tuning leg to produce a short at the junctions of inductors 706 and 718 and inductors 708 and 720. Remaining components in FIG. 11B are the same or similar as the components previously described with reference to FIG. 9.

As the reader will appreciate, the NMOS transistor structure of the present invention may be employed in any of the number of switched inductor applications within an RF circuit. However, additional structure included with the RF circuit may vary. For example, referring again to FIG. 11A, a tuning capacitor 1106 and switch 1107 may optionally be used. In such case, the particular tuning characteristics of the tuned portion 504 will differ with the addition of the capacitor 1106 and switch 1107.

Further, referring again to FIG. 11B, the NMOS transistors 918, 920, 910, and 912, that switch capacitors 914, 916, 904, and 906, need not have the particular NMOS transistor termination structure of the present invention in which the body of the transistor is tied to a reference supply voltage. Such is the case because the capacitors 904, 906, 918, and 920 provide isolation for the NMOS transistors 910, 912, 918, and 920, respectively.

Figure 12A:
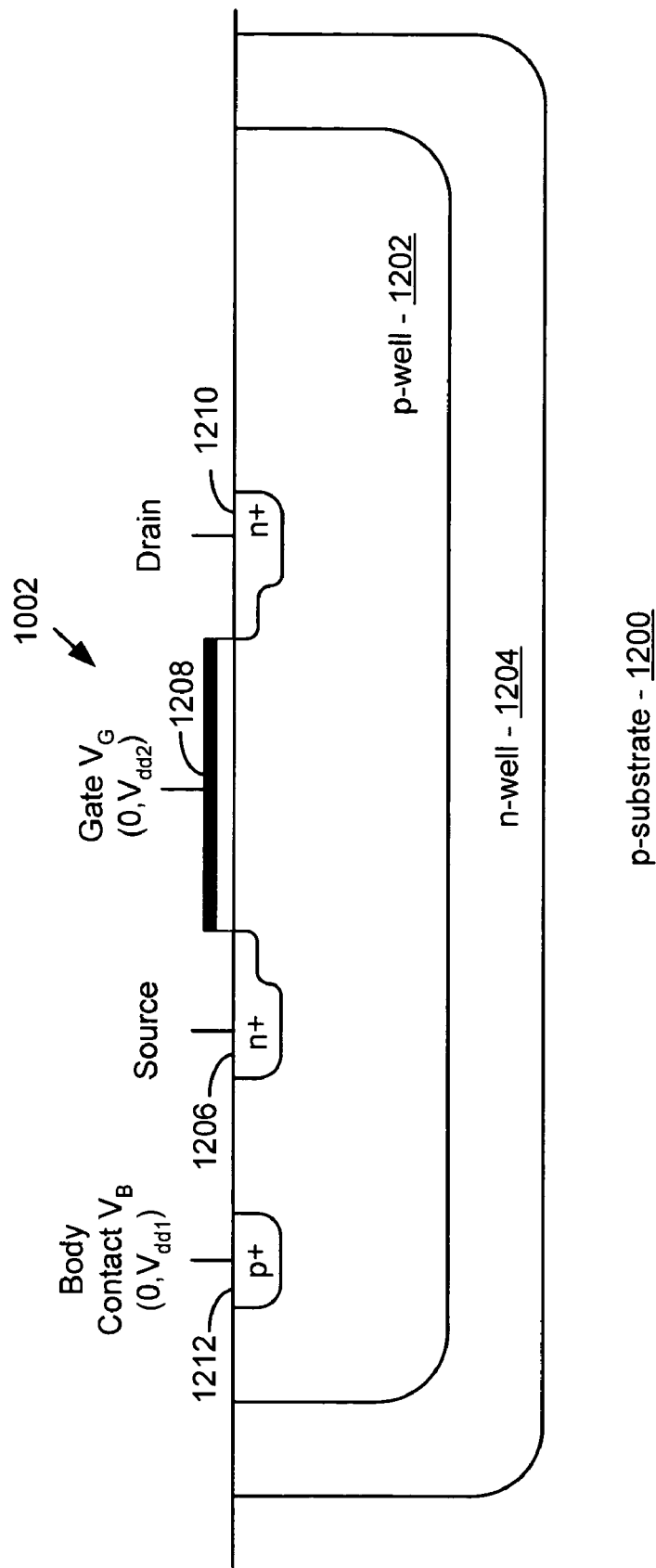
FIG. 12 is a diagrammatic cross-sectional diagram taken along a channel of an NMOS transistor of a tuned portion of an RF circuit constructed according to the present invention.

FIG. 12A is a diagrammatic cross-sectional diagram taken along a channel of an NMOS transistor 1002 of a tuned portion of an RF circuit constructed according to the present invention. As is illustrated, the NMOS transistor 1002 includes a gate 1208, a source 1206, a drain 1210, and a body that resides in a p-well 1202. The p-well 1202 is formed within an n-well 1204, which is formed in a p-substrate 1200. The structure of FIG. 12 is generally referred to as a triple-well option. With such a structure, the NMOS transistor 1002 may further include a body contact 1212, which is a highly doped p-contact formed within the p-well 1202. According to some embodiments of the present invention, the body contact 1212 is controllably biased at the $V_B$ supply voltage when the NMOS transistor 1002 is turned ON (or at all times) to correspond to the tank voltage of an inductor switched by the NMOS transistor 1002.

As is evidenced from the structure of FIG. 12A, with the body contact $V_B$ tied to $V_{dd1}$, the first supply voltage, e.g., 1.8V, the NMOS transistor 1002 may be turned ON by applying the second voltage supply ($V_{dd2}$, e.g., 3.3V) at the gate 1208 $V_G$. Further, with the gate 1208 $V_G$ coupled to a reference ground and the body contact $V_B$ coupled to ground, the NMOS transistor 1002 is turned OFF, even when the tank containing the inductor 1004 is tied to $V_{dd1}$ of 1.8 volts. Thus, the ON conductance requirements and OFF isolation requirements are satisfied for the switched inductor circuit and also the protection requirements for the NMOS transistor 1002 are satisfied. Such is the case because the maximum voltage at any time in the operation of the NMOS transistor 1002 will not exceed 1.8 volts across any terminal pair (Source, Drain, Gate, Body) of the NMOS transistor 1002.

Figure 12B:
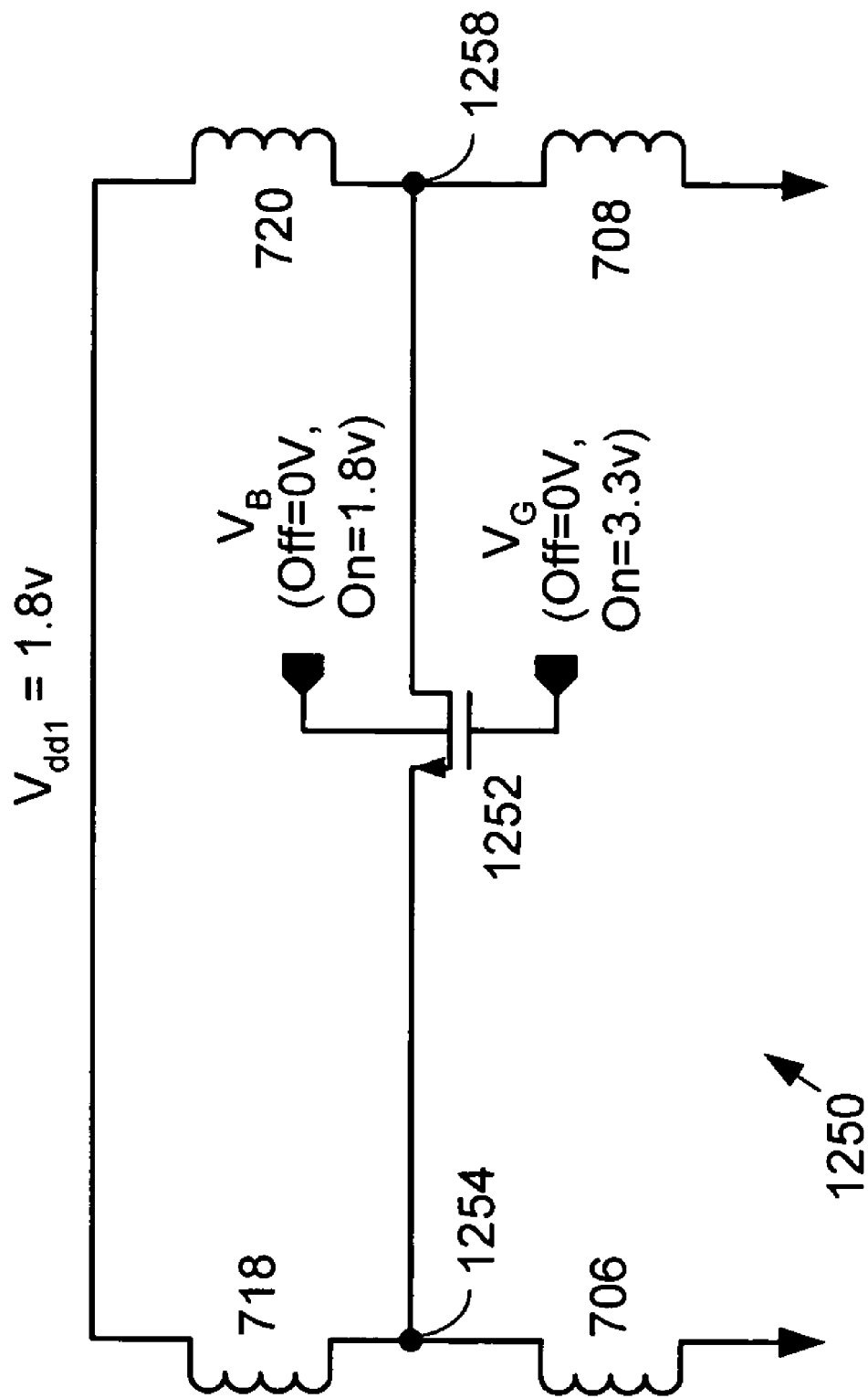

FIG. 12B is a circuit diagram illustrating one particular embodiment of a circuit including an NMOS transistor constructed and operating according to the present embodiment. NMOS transistor 1252 includes source and drain terminals that couple between nodes 1254 and 1258. The gate voltage $V_G$ and body voltage $V_B$ are controllable to turn on and turn off the transistor 1252 to resultantly apply a short or an open between nodes 1254 and 1258.

With drain and source terminals biased by supply voltage $V_{dd1}$ via inductors 718 and 720, the drain and source terminals are held, effectively, at $V_{dd1}$, i.e., 1.8 volts (in the illustrated embodiment). With the embodiment of FIG. 12B (and with at least some of the previously described embodiments) transistor 1252 is turned on by applying 1.8 volts ($V_{dd1}$) to the body of the transistor 1252 and 3.3 volts ($V_{dd2}$) to the gate of the transistor 1252. Further, transistor 1252 is turned off by applying 0 volts to the body of the transistor 1252 and 0 volts to the gate of the transistor 1252.

By holding the body of transistor at 1.8 volts instead of at 0 volts, the ON resistance of the transistor 1252 between the source and drain terminals (due to body effect) is reduced. While the body of the transistor 1252 could be held at 1.8 volts at all times, such operation would be with risk of the parasitic diodes (formed in conjunction with the transistors) being turned on by large swings at nodes 1254 and 1258.

Figure 13:
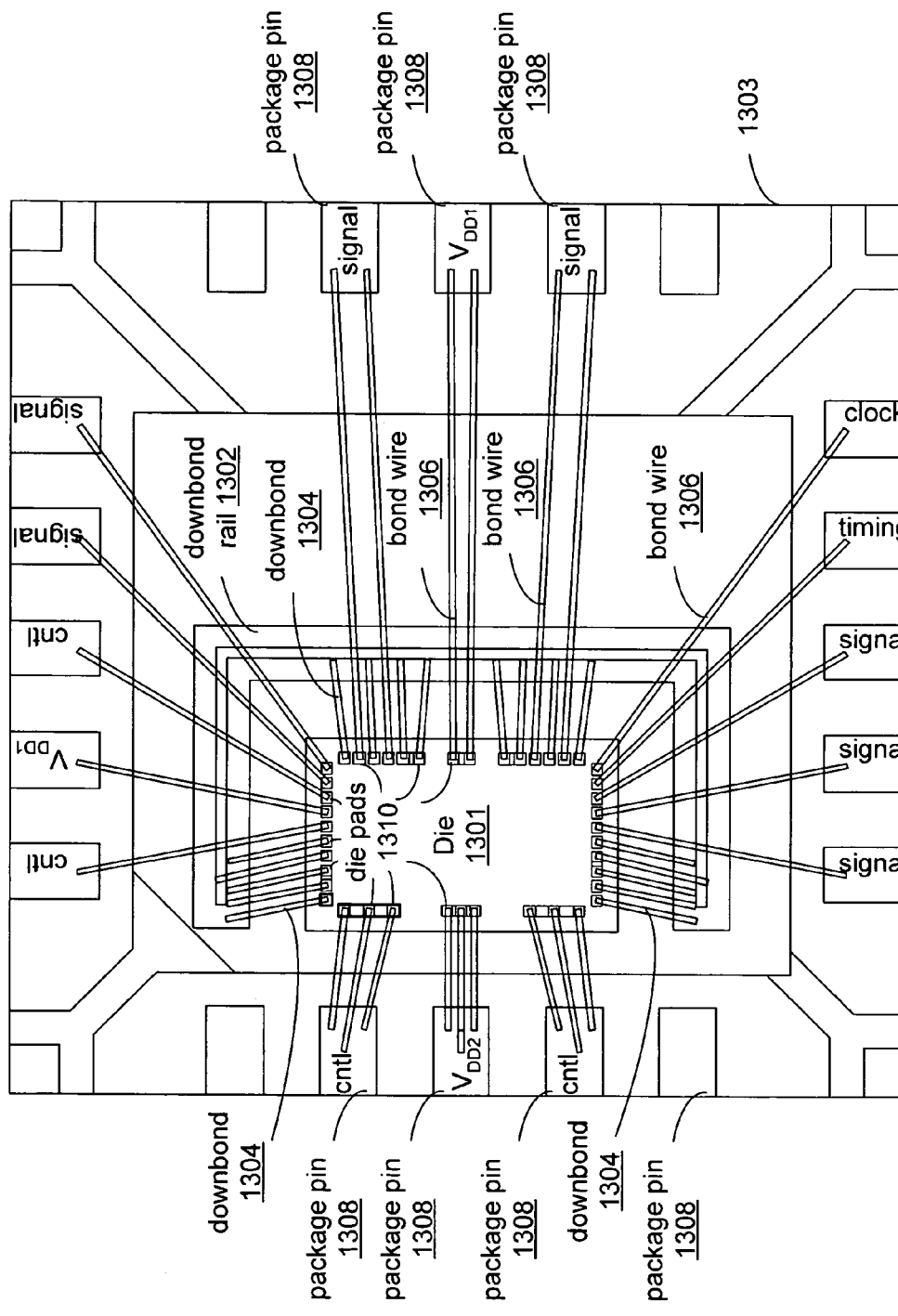
FIG. 13 is a diagrammatic top view of an RF device constructed according to the present invention.

FIG. 13 is a diagrammatic top view of an RF device constructed according to the present invention. The RF device 1300 of FIG. 13 includes a semi conductive die 1301 and a package 1303. The semi conductive die 1301 has a first portion of an RF circuit formed therein and thereon and includes a plurality of die pads 1310 formed thereon. One of these die pads 1310 corresponds to the first portion of the RF circuit. The first portion of the RF circuit includes components, some of which were described with reference to FIG. 2. Such an RF circuit is contained within one or more of the devices illustrated in FIG. 1. As those of ordinary skill in the art will appreciate, the RF circuit will include active and passive components such as those illustrated with reference to FIGS. 3–12.

The RF device 1300 includes a package 1303 in which the semi conductive die 1301 mounts. The package 1303 includes a heat slug upon which the semi conductive die 1301 resides. The heat slug is shown in detail in, and will be described with reference to FIG. 14A. The package 1303 further includes a plurality of package pins 1308. Each of these package pins 1308, when employed, couples to a signal line, a control line, a voltage supply, or a reference ground. These signals and other connections are well known in the art and will not be described further herein except as they relate to the present invention. The package 1303 further includes a plurality of bond wires 1306, each of which couples between a corresponding die pad 1310 and a corresponding package pin 1308. The package 1303 further comprises a downbond rail 1302 that couples to the heat slug. The connections to the package are referred to herein as package pins 1308. As the reader will appreciate, however, package connections differ in varying constructs. Thus, the term "package pin" is used to generically describe any type of package connector via which the package is coupled to a circuit board or other components of a device with which the package is used.

According to one aspect of the present invention, at least one downbond 1304 of the package 1303 couples between a corresponding die pad 1310 and a corresponding location on the downbond rail 1302 and serves as an inductor for a second portion of the RF circuit. In one construct of the RF device of the present invention, a plurality of downbonds 1304 coupled in parallel between a corresponding die pad 1310 and a downbond rail 1302 form the second portion of the RF circuit. Other particular examples of the structure will be further described with reference to FIGS. 14A–15. The length of a downbond 1304 that forms the second portion of the RF circuit may be selected to provide a desired inductance. Likewise, the downbond may also have a selected diameter to provide a desired inductance. When multiple bond wires are coupled in parallel to serve as an inductor of the second portion of the RF circuit, the length and diameter, as well as the proximity of the downbonds is selected such that the desired inductance is met.

FIG. 14A is a partial diagrammatic sectional side view taken along a central portion of the RF device 1300 of FIG. 13. As was previously described with reference to FIG. 13, the RF device 1300 includes, among other components, bond wires 1306, downbonds 1304, package pins 1308, and the downbond rail 1302. The package 1303 includes the heat slug 1402 and dielectric portions 1404 that provides the structure of the package 1303. The package 1303 typically mounts on a printed circuit board (PCB) so that the heat slug 1402 will dissipate heat produced by the die 1301 through its conductive bulk to the PCB. Further, a cooling fan, or simply the ambient atmosphere, will also dissipate heat produced within the die 1301. However, because the heat slug 1402 has large mass and greater surface area than does the die 1301, a significant portion of the heat generated by die 1301 in this operation will be dissipated through the heat slug 1402.

Still referring to FIG. 14A, multiple downbonds 1304 may extend from a single die pad to the downbond rail 1302. When multiple downbonds 1304 are used to form all or a portion of the second portion of the RF circuit, the downbonds are spaced appropriately and have selected length to provide a predetermined inductance. The predetermined inductance is based upon one or more desired tuning frequencies of the RF circuit.

FIG. 14B is a partial diagrammatic view of the RF device of FIG. 13 showing in some detail downbonds that form a portion of an RF circuit. Multiple downbonds 1424 and 1426 are shown to form the second portion of the RF circuit. The first portion of the RF circuit 1422 is formed in/on the semi conductive die 1301. The die pad 1310, as shown, couples to the downbonds 1424 and 1426. The downbonds 1424 and 1426 couple on a far end to the downbond rail 1302. The length 1428 and separation 1430 of the downbonds 1424 and 1426 are selected such that the downbonds 1424 and 1426 in combination provide the desired inductance. Further, the diameter of the downbonds 1424 and 1426 and the material used in their construction may be selected so that they, in combination, provide a desired inductance although normally these choices are made by other constraints.

FIG. 14C is another partial diagrammatic view of the RF device of FIG. 13 showing in some detail downbonds that form a portion of an RF circuit. The RF circuit first portion 1422 couples to the downbonds 1424 and 1426 that form a second portion of the RF circuit. Together, the RF circuit first portion 1422 and the downbonds 1424 and 1426 form the a complete RF circuit. Thus, the first portion of the RF circuit 1422 resides on the die 1301, while the second portion of the RF circuit includes downbonds 1424 and 1426.

FIG. 15A is a block diagram illustrating an RF circuit formed according to the embodiment of the present invention in which downbonds are used for inductors of the RF circuit. The example of the RF circuit 1500 illustrated uses downbonds as inductors within the circuit. Drawing an analogy to the structures of FIGS. 3 through 12, the RF circuit 1500 includes an active portion 1502 and a tuned portion 1504. When the active portion 1502 and the tuned portion 1504 are single-ended, a single coupling link 1506 couples these portions. However, when the active portion 1502 and the tuned portion 1504 are differential, two coupling links 1508 and 1510 may be employed to couple the active portion 1502 to the tuned portion 1504.

FIG. 15B is a schematic diagram illustrating a single ended embodiment of the RF circuit of FIG. 15A showing the manner in which downbonds serve as inductors and how they couple within the RF circuit. As shown in FIG. 15B, an example of the RF circuit 1500 includes a plurality of lumped elements. The active portion 1502 includes transistor 1512 that receives an RF signal $V_{in}$ and that produces an RF signal $V_{out}$ at output node 1514. Load inductor 1516 couples between the drain of transistor 1512 (output node 1514) and voltage supply Vdd. Tuned portion 1504 includes inductors 1518 and 1520. Each of these inductors 1518 and 1520 may be formed with one or more downbonds extending from a die pad to the downbond rail, the downbond rail serving as a reference ground voltage. In one particular embodiment, inductor 1518 (formed from one or more downbonds) is switched via transistor 1522. DC blocking capacitor 1526 may be required depending upon the embodiment. Second inductor 1520 may also be formed from one or more downbonds.

Figure 15C:
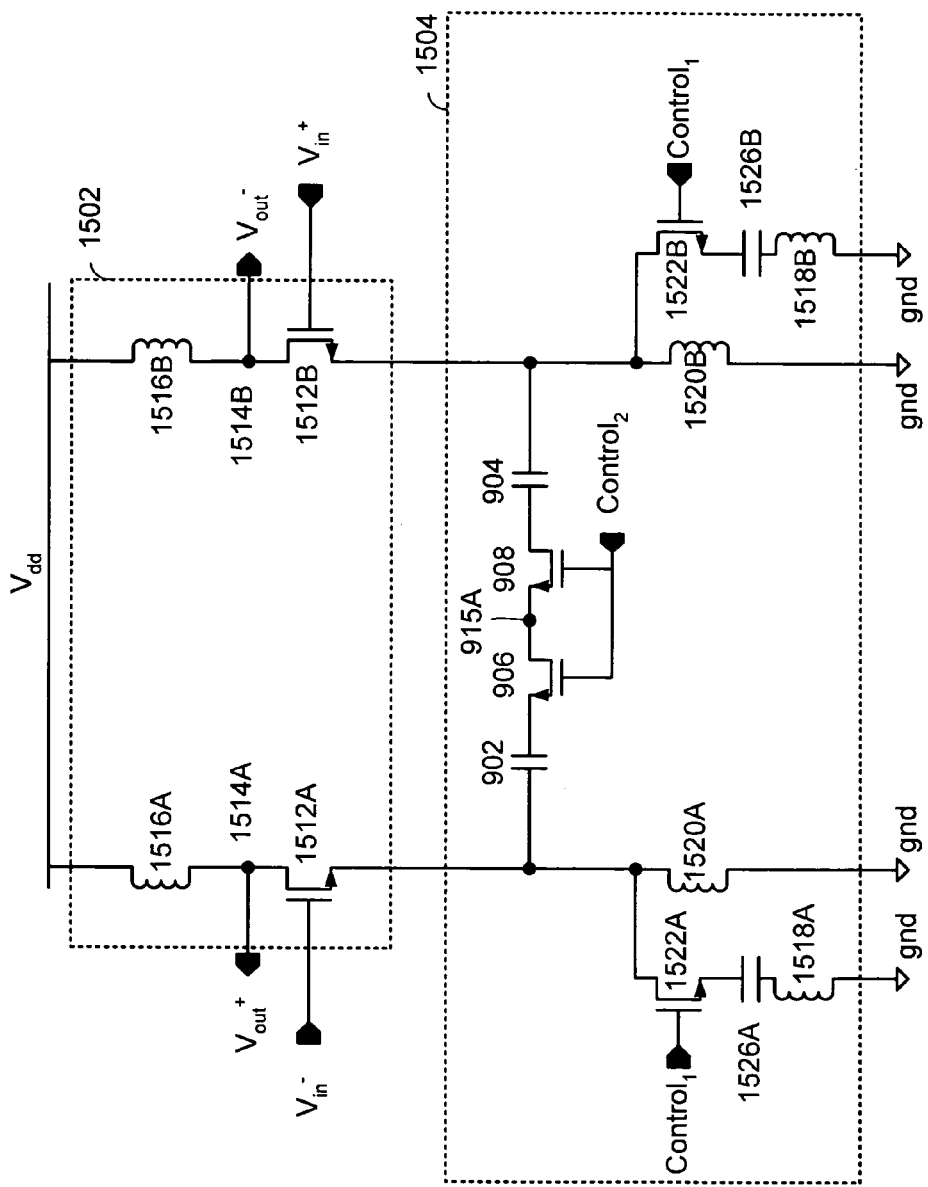
FIG. 15C is a schematic diagram illustrating a differential ended embodiment of the RF circuit of FIG. 15A showing the manner in which downbonds serve as inductors and how they couple within the RF circuit.

FIG. 15C is a schematic diagram illustrating a differential ended embodiment of the RF circuit of FIG. 15A showing the manner in which downbonds serve as inductors and how they couple within the RF circuit. The active portion 1502 includes transistors 1512A and 1512B that receive respective differential RF signals $V_{in}^-$ and $V_{in}^+$, respectively. The active portion 1502 produces differential RF signal $V_{out}^+$ and $V_{out}^-$ at output nodes 1514A and 1514B, respectively. The active portion 1502 further includes load inductors 1516A and 1516B that couple between the drains of transistors 1512A and 1522, respectively, and voltage supply Vdd. Tuned portion 1504 includes inductors 1518A, 1518B, 1520A, and 1520B. Each of these inductors 1518A, 1518B, 1520A, and 1520B may be formed as one or more downbonds extending from a die pad to the downbond rail, the downbond rail serving as a reference ground voltage. In one particular embodiment, inductors 1518A and 1518B are switched via transistors 1522A and 1522B, respectively. DC blocking capacitors 1526A and 1526B may be required depending upon the embodiment. The tuning portion 1504 may also include tuning capacitors 902 and 904 that are switched in and out of the tuning portion 1504 via transistors 906 and 908. Center tap 915A may be tied to a reference voltage or ground.

As one of average skill in the art will appreciate, the term "substantially" or "approximately," as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled." As one of average skill in the art will further appreciate, the term "compares favorably," as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A Radio Frequency (RF) device comprising:
   a semi conductive die having a first portion of an RF circuit and a plurality of die pads formed thereon; and
   a package in which the semi conductive die mounts, the package including:
   a heat slug upon which the semi conductive die resides;
   a plurality of package pins;
   a plurality of bond wires, each of which couples between a corresponding die pad and a corresponding package pin;
   a downbond rail coupled to the heat slug; and
   at least one downbond that couples between a die pad corresponding to the first portion of the RF circuit and a respective location on the downbond rail and that serves as an inductor for a second portion of the RF circuit.

2. The RF device of claim 1, wherein the at least one downbond comprises a plurality of downbonds coupled in parallel between the die pad corresponding to the first portion of the RF circuit and respective locations on the downbond rail.

3. The RF device of claim 1, wherein the at least one downbond has a length selected to provide a desired inductance.

4. The RF device of claim 1, wherein the at least one downbond has a diameter selected to provide a desired inductance.

5. The RF device of claim 4, wherein the at least one downbond has a length selected to provide a desired inductance.

6. The RF device of claim 1, further comprising a switch operable to couple/decouple the at least one downbond from the first portion of the RF circuit.

7. The RF device of claim 6, wherein the switch comprises an NMOS transistor.

8. The RF device of claim 7, wherein the switch further comprises an DC blocking capacitor.

9. The RF device of claim 6, wherein the switch comprises a PMOS transistor.

10. The RF device of claim 9, wherein the switch further comprises an DC blocking capacitor.

11. A Radio Frequency (RF) circuit comprising:
a first portion formed on a semi conductive die and comprising:
a plurality of circuit components formed in/on the semi conductive die, the semi conductive die mounted in a package; and
a die pad formed on the semi conductive die and communicatively coupled to the plurality of circuit components; and
a second portion comprising:
a downbond rail of the package; and
at least one downbond that couples between the die pad and a respective location on the downbond rail and that serves as an inductor for a second portion of the RF circuit.

12. The RF circuit of claim 11, wherein the at least one downbond comprises a plurality of downbonds coupled in parallel between the die pad and respective locations on the downbond rail.

13. The RF circuit of claim 11, wherein the at least one downbond has a length selected to provide a desired inductance.

14. The RF circuit of claim 11, wherein the at least one downbond has a diameter selected to provide a desired inductance.

15. The RF circuit of claim 14, wherein the at least one downbond has a length selected to provide a desired inductance.

16. The RF circuit of claim 11, further comprising a switch operable to couple/decouple the die pad from the plurality of circuit components formed in/on the semi conductive die.

17. The RF circuit of claim 16, wherein the switch comprises an NMOS transistor.

18. The RF circuit of claim 17, wherein the switch further comprises an DC blocking capacitor.

19. The RF circuit of claim 16, wherein the switch comprises a PMOS transistor.

20. The RF circuit of claim 19, wherein the switch further comprises an DC blocking capacitor.

21. A Radio Frequency (RF) device comprising:
a case;
a user interface;
an antenna;
an integrated circuit communicatively coupled to the antenna and to the user interface, the integrated circuit comprising:
a semi conductive die having a first portion of an RF circuit and a plurality of die pads formed thereon, the semi conductive die; and
a package in which the semi conductive die mounts, the package including:
a heat slug upon which the semi conductive die resides;
a plurality of package pins;
a plurality of bond wires, each of which couples between a corresponding die pad and a corresponding package pin;
a downbond rail coupled to the heat slug; and
at least one downbond that couples between a die pad corresponding to the first portion of the RF circuit and a respective location on the downbond rail and that serves as an inductor for a second portion of the RF circuit.

22. The RF device of claim 21, wherein the at least one downbond comprises a plurality of downbonds coupled in parallel between the die pad corresponding to the first portion of the RF circuit and respective locations on the downbond rail.

23. The RF device of claim 21, wherein the at least one downbond has a length selected to provide a desired inductance.

24. The RF device of claim 21, wherein the at least one downbond has a diameter selected to provide a desired inductance.

25. The RF device of claim 24, wherein the at least one downbond has a length selected to provide a desired inductance.

26. The RF device of claim 21, further comprising a switch operable to couple/decouple the at least one downbond from the first portion of the RF circuit.

27. The RF device of claim 26, wherein the switch comprises an NMOS transistor.

28. The RF device of claim 27, wherein the switch further comprises an DC blocking capacitor.

29. The RF device of claim 26, wherein the switch comprises a PMOS transistor.

30. The RF device of claim 29, wherein the switch further comprises an DC blocking capacitor.

31. A differential circuit comprising:
a differential active portion that receives a differential RF signal and that operates upon the differential RF signal; and
a differential tuned portion coupled to the active portion having a first side and a second side, each side comprising:
a first inductor;
a downbond that serves as a second inductor; and
a switch coupled to the second inductor, wherein when the switch is open the second inductor couples with the first inductor and the tuned portion has first tuning characteristics, and wherein when the switch is closed the second inductor is decoupled from the first inductor and the tuned portion has second tuning characteristics.

32. The differential circuit of claim 31, wherein the first inductor comprises a downbond.

* * * * *